(12) United States Patent
Nishii et al.

(10) Patent No.: US 8,962,379 B2
(45) Date of Patent: Feb. 24, 2015

(54) METHOD OF PRODUCING CIGS FILM, AND METHOD OF PRODUCING CIGS SOLAR CELL BY USING SAME

(75) Inventors: Hiroto Nishii, Ibaraki (JP); Shigenori Morita, Ibaraki (JP); Seiki Teraji, Ibaraki (JP); Kazuhito Hosokawa, Ibaraki (JP); Takashi Minemoto, Kusatsu (JP)

(73) Assignee: Nitto Denko Corporation, Ibaraki-shi (JP)

( * ) Notice: Subject to any disclaimer, the term of this patent is extended or adjusted under 35 U.S.C. 154(b) by 0 days.

(21) Appl. No.: 14/241,007

(22) PCT Filed: Sep. 5, 2012

(86) PCT No.: PCT/JP2012/072590
§ 371 (c)(1),
(2), (4) Date: Feb. 25, 2014

(87) PCT Pub. No.: WO2013/035732
PCT Pub. Date: Mar. 14, 2013

(65) Prior Publication Data
US 2014/0220729 A1 Aug. 7, 2014

(30) Foreign Application Priority Data

Sep. 7, 2011 (JP) ................................ 2011-194933

(51) Int. Cl.
*H01L 21/00* (2006.01)
*H01L 31/18* (2006.01)
(Continued)

(52) U.S. Cl.
CPC ........ *H01L 31/1864* (2013.01); *H01L 31/0322* (2013.01); *H01L 31/0749* (2013.01); *Y02E 10/541* (2013.01)
USPC ............. 438/95; 136/262; 136/264; 136/265; 438/93; 438/102; 438/478; 438/796

(58) Field of Classification Search
USPC ............. 136/262, 264, 265; 438/93, 95, 102, 438/478, 796
See application file for complete search history.

(56) References Cited

U.S. PATENT DOCUMENTS

| 5,356,839 A | 10/1994 | Tuttle et al. |
| 5,436,204 A | 7/1995 | Albin et al. |

(Continued)

FOREIGN PATENT DOCUMENTS

| JP | 10-513606 A | 12/1998 |
| JP | 2000-156517 A | 6/2000 |

(Continued)

OTHER PUBLICATIONS

International Search Report dated Dec. 4, 2012 issued in corresponding application No. PCT/JP2012/072590.
(Continued)

*Primary Examiner* — Asok K Sarkar
(74) *Attorney, Agent, or Firm* — Westerman, Hattori, Daniels & Adrian, LLP

(57) ABSTRACT

A CIGS film production method is provided which ensures that a CIGS film having a higher conversion efficiency can be produced at lower costs at higher reproducibility even for production of a large-area device. A CIGS solar cell production method is also provided for producing a CIGS solar cell including the CIGS film. The CIGS film production method includes: a stacking step of stacking a layer (A) containing indium, gallium and selenium and a layer (B) containing copper and selenium in a solid phase in this order over a substrate; and a heating step of heating a stacked structure including the layer (A) and the layer (B) to melt a compound of copper and selenium of the layer (B) into a liquid phase to thereby diffuse copper from the layer (B) into the layer (A) to permit crystal growth to provide a CIGS film.

6 Claims, 7 Drawing Sheets

(51) Int. Cl.
*H01L 31/032* (2006.01)
*H01L 31/0749* (2012.01)

(56) References Cited

U.S. PATENT DOCUMENTS

| | | | |
|---|---|---|---|
| 5,441,897 A | | 8/1995 | Noufi et al. |
| 2007/0169809 A1* | | 7/2007 | Van Duren et al. ........... 136/262 |
| 2009/0130796 A1* | | 5/2009 | Taunier et al. .................. 438/94 |
| 2009/0183675 A1* | | 7/2009 | Pinarbasi et al. ............. 118/500 |
| 2009/0208636 A1 | | 8/2009 | Choi |
| 2010/0212733 A1* | | 8/2010 | Schmidt et al. ............... 136/256 |
| 2011/0114182 A1* | | 5/2011 | Robinson et al. ............. 136/262 |
| 2011/0136293 A1* | | 6/2011 | Aksu et al. ...................... 438/84 |
| 2011/0174363 A1* | | 7/2011 | Munteanu .................... 136/255 |

FOREIGN PATENT DOCUMENTS

| JP | 2004-342678 A | 12/2004 |
|---|---|---|
| JP | 2009-541991 A | 11/2009 |
| JP | 2011-60891 A | 3/2011 |

OTHER PUBLICATIONS

Notification of Transmittal of Translation of the International Preliminary Report on Patentabililty (Form PCT/IB/338) of International Application No. PCT/JP2012/072590 mailed Mar. 20, 2014 with Forms PCT/IB/373 and PCT/ISA/237 (7 pages).

* cited by examiner

FIG. 4
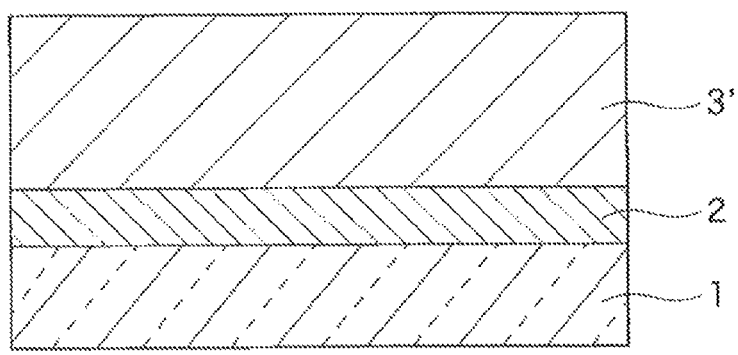
FIG. 5
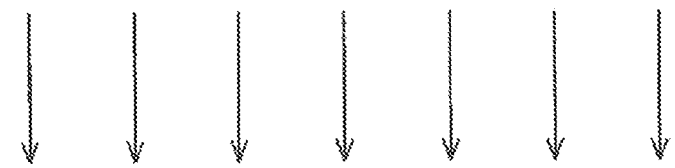
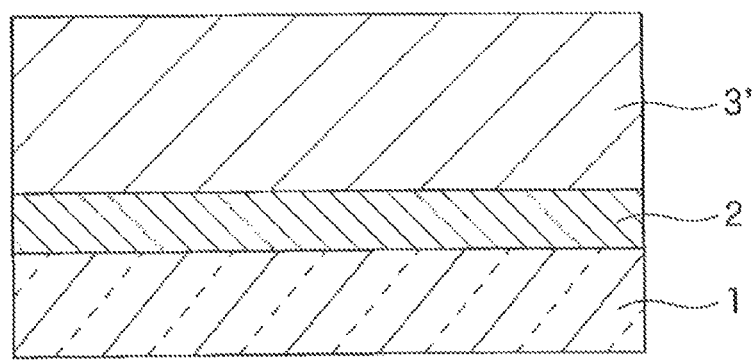

8,962,379 B2

METHOD OF PRODUCING CIGS FILM, AND METHOD OF PRODUCING CIGS SOLAR CELL BY USING SAME

TECHNICAL FIELD

The present invention relates to a method of producing a CIGS film to be used as a light absorbing layer for a CIGS solar cell having excellent characteristic properties by uniform diffusion of copper and uniform formation of crystal grains, and to a method of producing a CIGS solar cell by using the CIGS film production method.

BACKGROUND ART

Thin film solar cells typified by amorphous silicon solar cells and compound thin film solar cells allow for significant reduction in material costs and production costs as compared with conventional crystalline silicon solar cells. Therefore, research and development have been rapidly conducted on these thin film solar cells in recent years. Among these thin film solar cells, a CIGS solar cell which is a type of compound thin film solar cell produced by employing Group I, III and VI elements as constituents and including a light absorbing layer composed of an alloy of copper (Cu), indium (In), gallium (Ga) and selenium (Se) is particularly attractive, because the CIGS solar cell is excellent in solar light conversion efficiency (hereinafter referred to simply as "conversion efficiency") and is produced without the use of silicon.

The light absorbing layer of the CIGS solar cell can be produced by a selenization process, a non-vacuum (nanoparticle) process, a vacuum evaporation process or the like. The vacuum evaporation process is a film formation process in which a film is formed through evaporation by heating separate evaporation sources of Cu, In, Ga and Se and, therefore, is advantageous in that the feed amounts of the respective elements can be controlled for the formation of the film, making it possible to control the composition of the film in thickness direction.

A so-called three-stage process, which is a type of multisource evaporation process out of the vacuum evaporation process, ensures the highest conversion efficiency. As shown in FIG. 8B, this process is divided into three stages. At the first stage, In, Ga and Se are deposited on a substrate through evaporation to form an $(In,Ga)_2Se_3$ film. At the second stage, the temperature of the substrate is elevated to 550° C., and Cu and Se are further deposited on the resulting substrate through evaporation to form a CIGS film having a Cu-rich composition. At this stage, two phases, i.e., a liquid phase $Cu_{(2-x)}Se$ and a solid phase CIGS, coexist in the CIGS film, and crystal grains rapidly grow to greater size in the presence of $Cu_{(2-x)}Se$.

On the other hand, it is known that $Cu_{(2-x)}Se$ adversely affects the characteristic properties of the solar cell because of its lower electrical resistance. In the three-stage process, therefore, In, Ga and Se are deposited through evaporation at the third stage to reduce the amount of $Cu_{(2-x)}Se$, so that the CIGS film has a composition slightly rich in Group-III element as a whole. The CIGS thin film obtained by the three-stage process has greater crystal grain diameters and, in addition, has a thin film crystalline structure having a crystallographically higher quality than a CIGS film formed by a conventional evaporation process (for example, PLT1).

Where the CIGS film formed by the three-stage process is used for a solar cell of a smaller-area device, the solar cell is indeed advantageous with a higher conversion efficiency. However, $Cu_{(2-x)}Se$, which is a major component causing the crystal growth, is supplied in a liquid phase from the beginning, so that Cu is not necessarily uniformly diffused in the CIGS film and the crystal grains are not necessarily uniform in a strict sense. Where a large-area device is produced by utilizing the CIGS film, there is device-to-device variation in conversion efficiency with poorer reproducibility. Further, $Cu_{(2-x)}Se$ is supplied in a liquid phase and, therefore, is excessively taken into the film. Problematically, this reduces the characteristic properties of the device.

CITATION LIST

Patent Literature

PLT1: JP-A-HEI10 (1998)-513606

SUMMARY OF INVENTION

In view of the foregoing, it is an object of the present invention to provide a CIGS film production method which ensures that a CIGS film having a higher conversion efficiency can be produced at lower costs at higher reproducibility even for production of a large-area device and to provide a method of producing a CIGS solar cell including the CIGS film.

According to a first aspect of the present invention to achieve the object described above, there is provided a CIGS film production method for producing a CIGS film to be used as a light absorbing layer for a CIGS solar cell, the method comprising a stacking step of stacking a layer (A) comprising indium, gallium and selenium and a layer (B) comprising copper and selenium in a solid phase in this order on a substrate, and a heating step of heating a stacked structure including the layer (A) and the layer (B) to melt the layer (B) into a liquid phase to thereby diffuse copper from the layer (B) into the layer (A) to permit crystal growth to provide the CIGS film.

According to a second inventive aspect, there is provided a CIGS solar cell production method including the steps of providing a rear electrode layer on a substrate, providing a light absorbing layer, providing a buffer layer and providing a transparent electrically conductive layer, wherein the CIGS film production method according to the first inventive aspect is employed for the light absorbing layer providing step.

The inventors of the present invention conducted studies concentrating on a CIGS solar cell out of compound semiconductor solar cells in order to provide a solar cell having a higher light absorption coefficient and effective for resource saving. As a result, the inventors found that, where the CIGS film is formed as the light absorbing layer for the CIGS solar cell by stacking a layer (A) containing In, Ga and Se and a layer (B) containing Cu and Se in a solid phase in this order over a substrate and heating a stacked structure including the layer (A) and the layer (B) to melt a compound of Cu and Se of the layer (B) into a liquid phase to thereby diffuse Cu from the layer (B) into the layer (A) to permit crystal growth as shown in FIG. 8A, rather than by the prior-art three-stage process shown in FIG. 8B, it is possible to uniformly form greater crystal grains in the film while preventing $Cu_{(2-x)}Se$ from being excessively taken into the film, and attained the present invention. Where the inventive CIGS film production method is used to partly produce the CIGS solar cell, greater crystal grains are uniformly formed in the CIGS film serving as the light absorbing layer and, therefore, the CIGS solar cell thus produced has an increased conversion efficiency and is less liable to suffer from device-to-device variation in conversion efficiency. In addition, $Cu_{(2-x)}Se$ is not generated in excess in the CIGS film, so that the characteristic properties of the cell are not adversely affected. Thus, the CIGS solar cell can be produced at higher reproducibility as having a higher efficiency.

In the present invention, the term "solid phase" means a phase in which a substance is in a solid state at a given temperature, and the term "liquid phase" means a phase in which a substance is in a liquid state at a given temperature.

In the present invention, the expression "stacking a layer (A) and a layer (B) over a substrate" means not only that these layers are stacked directly over the substrate but also that these layers are stacked over the substrate with the intervention of other layers.

In the inventive CIGS film production method, as described above, the layer (A) comprising In, Ga and Se and the layer (B) comprising Cu and Se are stacked in this order over the substrate. Therefore, the solid phase layer (B) having a uniform thickness can be stacked on the solid phase layer (A). At this stage, mutual diffusion between these layers is suppressed. Then, the resulting stacked structure including these two layers (A), (B) is heated to melt the compound of Cu and Se of the layer (B) into the liquid phase, whereby Cu is rapidly diffused from the layer (B) into the layer (A). At this time, Cu is uniformly diffused from the layer (B) into the layer (A) because the layer (B) is formed to a uniform thickness on the layer (A) in the previous step. Therefore, greater crystal grains are uniformly formed. Since the layer (B) is once provided in the solid phase, $Cu_{(2-x)}Se$ is substantially prevented from being excessively taken into the CIGS film. Therefore, the CIGS solar cell employing the CIGS film produced by this production method has a higher conversion efficiency, and is less liable to suffer from device-to-device variation in conversion efficiency. In addition, the characteristic properties of the cell are not adversely affected because $Cu_{(2-x)}Se$ is not generated in excess in the film.

Where the stacking step is performed at a temperature of 100° C. to 250° C., the mutual diffusion at an interface between the layer (A) and the layer (B) can be minimized, so that greater crystal grains can be uniformly formed by heating the resulting stacked structure in the subsequent step.

Where the heating step is performed at a temperature of not lower than 520° C., the compound of Cu and Se of the layer (B) is substantially melted. Therefore, Cu can be rapidly and uniformly diffused from the layer (B) into the layer (A), whereby greater crystal grains can be uniformly formed.

Where temperature increase from the temperature for the stacking step to the temperature for the heating step is carried out at a temperature increase rate of not less than 10° C./sec, the layer (B) is rapidly liquefied. Therefore, Cu is rapidly diffused from the layer (B) into the layer (A), whereby greater crystals are uniformly formed in the layer.

Where Se vapor or hydrogen selenide ($H_2Se$) is supplied to maintain a Se partial pressure at a higher level on a surface of the CIGS film than inside the CIGS film in the heating step, Se is substantially prevented from being released from the CIGS film in the heating step and, therefore, the CIGS film can have a more advantageous composition.

The CIGS film obtained at completion of the heating step may have a molar ratio satisfying $0.95 < Cu/(In+Ga) < 1.30$, and In, Ga and Se may be further deposited through evaporation on the CIGS film obtained by the heating step with the temperature for the heating step being maintained to thereby allow the CIGS film to have a molar ratio satisfying $0.70 < Cu/(In+Ga) < 0.95$. Where the CIGS film obtained at the completion of the heating step has a composition satisfying a molar ratio of $0.95 < Cu/(In+Ga) < 1.30$, the Cu component is sufficiently diffused in the interface between the layer (A) and the layer (B) to permit crystal growth. In addition, $Cu_{(2-x)}Se$ is not excessively taken into the CIGS film, so that the characteristic properties of a device employing the CIGS film are not impaired. Ga and Se are further deposited through evaporation on the CIGS film obtained by the heating step with the temperature for the heating step being maintained to thereby allow the CIGS film to have a composition satisfying a molar ratio of $0.70 < Cu/(In+Ga) < 0.95$, the CIGS film can be slightly deficient in Cu as a whole. When the CIGS film is used for a device, therefore, the CIGS film serves as a light absorbing layer having a higher efficiency.

Where the CIGS solar cell production method includes the steps of providing a rear electrode layer over a substrate, providing a CIGS film, providing a buffer layer and providing a transparent electrically conductive layer and the CIGS film production method according to the first inventive aspect is employed for the CIGS film providing step, the resulting CIGS solar cell is less liable to suffer from device-to-device variation in conversion efficiency, and has higher reproducibility and sufficiently high conversion efficiency.

BRIEF DESCRIPTION OF DRAWINGS

FIG. 4 is a diagram for explaining the CIGS film production method.

FIG. 5 is a diagram for explaining the CIGS film production method.

DESCRIPTION OF EMBODIMENTS

Next, an embodiment for carrying out the present invention is described.

Figure 1:
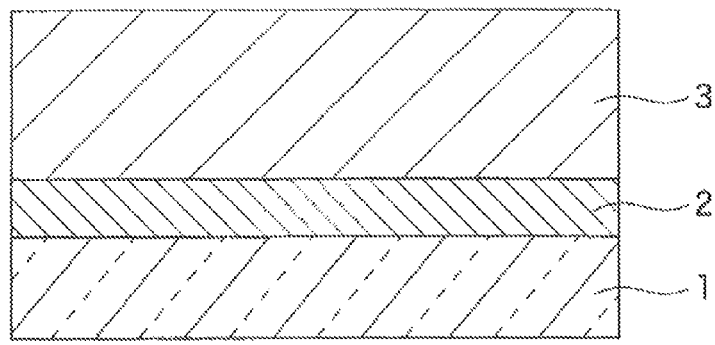
FIG. 1 is a diagram for explaining a CIGS film to be obtained in a first embodiment of the present invention.

FIG. 1 is a diagram for explaining a CIGS film 3 to be obtained in a first embodiment of the present invention. In FIG. 1, the CIGS film 3 is used as a light absorbing layer for a CIGS solar cell. A rear electrode layer 2 of molybdenum (Mo) is provided over a substrate 1 of soda-lime glass (SLG), and the CIGS film 3 is provided on the rear electrode layer 2. The components described above will hereinafter each be described in detail, and a method of producing the CIGS film 3 will be described in detail. The components are schematically shown in FIG. 1, and the actual thicknesses and dimensions of the respective components are different from those shown in FIG. 1 (this is also true in the other drawings to be described below).

In FIG. 1, the substrate 1 is used as a support base. Besides the SLG, a flexible metal foil or the like may be used as the substrate. However, a material resistant to a temperature of not lower than 520° C. so as to withstand heating in the subsequent heating step is preferably used.

The rear electrode layer 2 is formed by a sputtering method. Examples of a material for the rear electrode layer 2 include tungsten, chromium and titanium in addition to Mo. The rear electrode layer 2 may have a single layer structure or a multi-layer structure. The rear electrode layer 2 preferably has a thickness of 100 nm to 1000 nm.

The CIGS film 3 is made of a compound semiconductor including four elements, i.e., Cu, In, Ga and Se, and has a thickness of 2.0 μm. The composition ratio of Cu, In and Ga is Cu:In:Ga=22.1:21.2:7.5, i.e., Cu/(In+Ga)≈0.77 (molar ratio).

Figure 2:
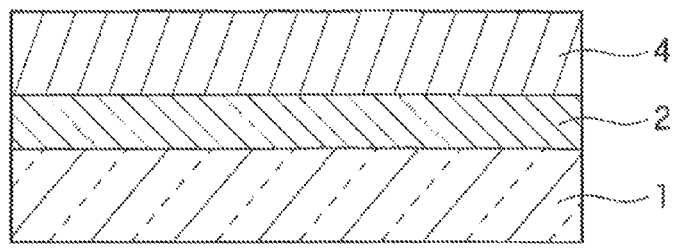
FIG. 2 is a diagram for explaining a production method for the CIGS film described above.

The CIGS film 3 can be produced in the following manner. First, a substrate 1 formed with a rear electrode layer 2 is prepared and, as shown in FIG. 2, In, Ga and Se are deposited through evaporation on a side of the substrate 1 formed with the rear electrode layer 2 with the substrate 1 maintained at a temperature of 200° C. Thus, a layer (A) 4 is formed on the rear electrode layer 2.

Figure 3:
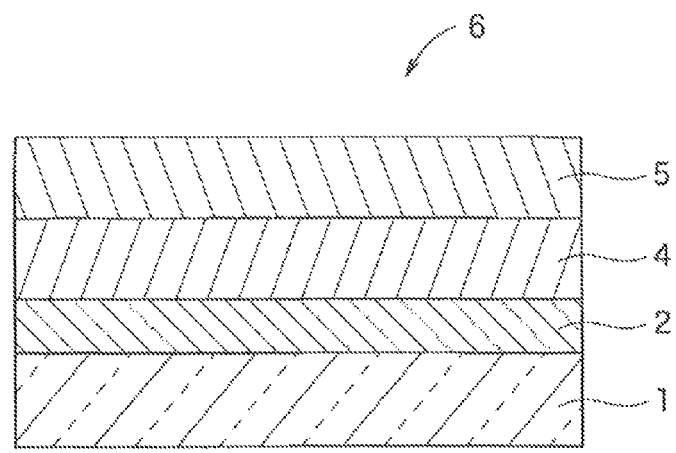
FIG. 3 is a diagram for explaining the CIGS film production method.

Then, as shown in FIG. 3, Cu and Se are deposited through evaporation on the layer (A) 4 with the substrate 1 maintained at a temperature of 200° C. Thus, a layer (B) 5 is formed on the layer (A) 4 to provide a stacked structure 6. At this time, the layer (A) 4 and the layer (B) 5 are each in a solid phase, so that diffusion between these layers is minimized. Therefore, the crystal growth does not occur at this stage.

Further, the stacked structure 6 is heated to maintain the substrate 1 at a temperature of 550° C., and Se vapor generated through sublimation by heating is supplied. The stacked structure is maintained in this state for 15 minutes, whereby a compound of Cu and Se of the layer (B) is melted into a liquid phase. Thus, Cu is diffused from the layer (B) into the layer (A), whereby crystal growth occurs in the stacked structure. At this time, crystals grow in a direction parallel to the substrate. In this heating step, the layer (A) and the layer (B) are unified to provide a CIGS film 3' (see FIG. 4). At this time, the CIGS film 3' has a composition ratio of Cu:In:Ga=25.1:18.5:6.4, i.e., Cu/(In+Ga)≈1.00 (molar ratio).

Temperature increase from the temperature (200° C.) for the stacking step to the temperature (550° C.) for the heating step is carried out at a temperature increase rate of 10° C./sec. If the temperature increase rate is too low, the liquefaction of the layer (B) will proceed slowly, making it impossible to rapidly diffuse Cu from the layer (B) into the layer (A). This tends to make it impossible to provide greater crystal grains. Therefore, the temperature increase rate is preferably not less than 10° C./sec.

Figure 6:
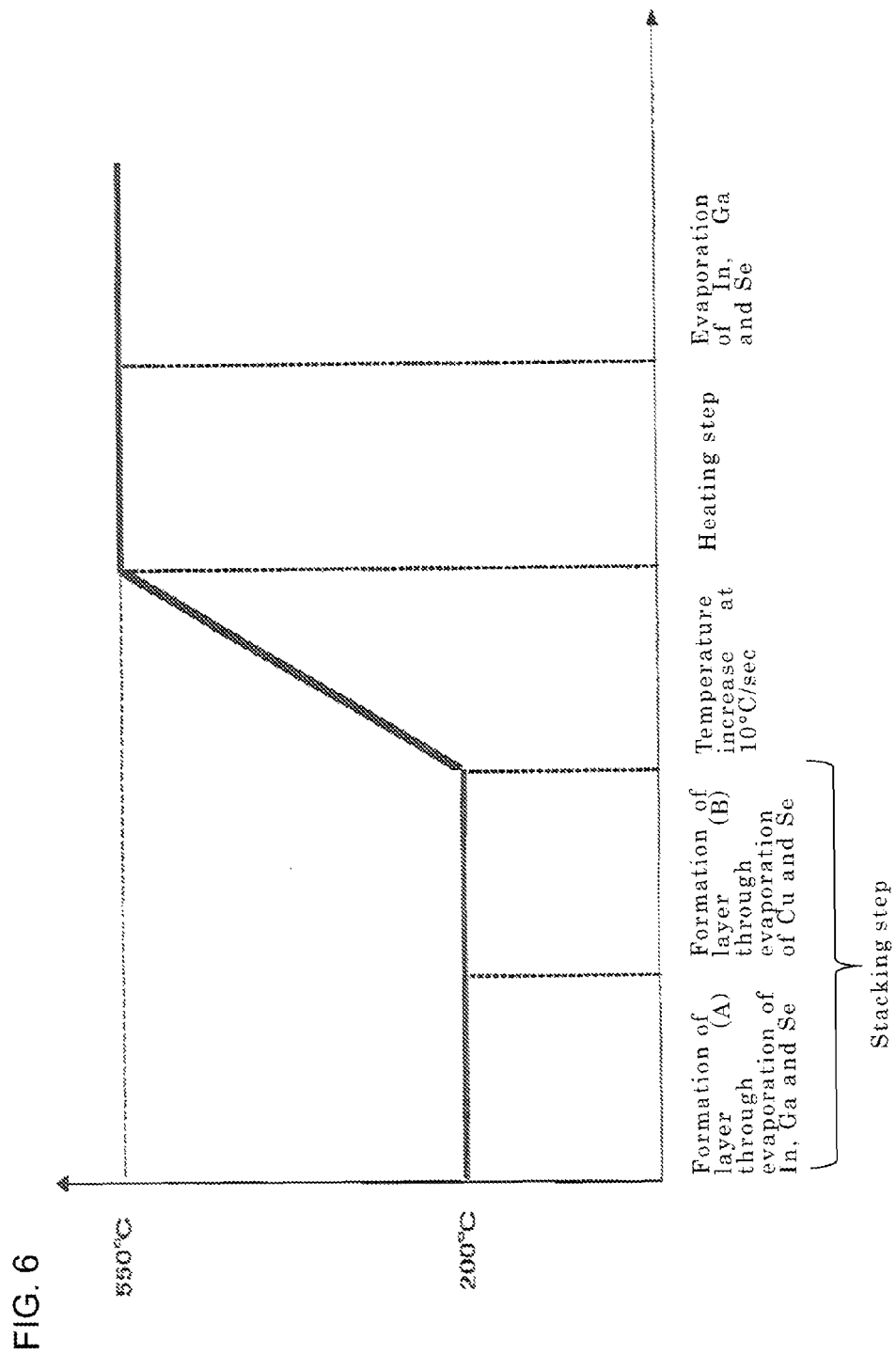
FIG. 6 is a diagram for explaining the CIGS film production method.

Then, as shown in FIG. 5, In, Ga and Se are further deposited through evaporation on the CIGS film 3' produced by the unification of the layer (A) and the layer (B), while the substrate 1 is maintained at a temperature of 550° C. which is the same as in the heating step and Se vapor generated through sublimation by heating is supplied. Thus, the CIGS film 3 described above (see FIG. 1) can be provided. Thus, the CIGS film 3 can be slightly deficient in Cu as a whole. The profile of the temperature at which the substrate 1 is maintained in the embodiment described above is shown in FIG. 6.

In this CIGS film production method, as described above, the layer (A) 4 including In, Ga and Se and the layer (B) 5 including Cu and Se are stacked in this order over the substrate 1 at a temperature of 200° C., and then the resulting stacked structure 6 including the layer (A) 4 and the layer (B) 5 is heated to maintain the substrate 1 at a temperature of 550° C. for 15 minutes. Thus, the compound of Cu and Se of the layer (B) 5 is melted into the liquid phase, whereby Cu is rapidly diffused from the layer (B) 5 into the layer (A) 4. Since Cu can be uniformly diffused into the layer (A) 4 from the layer (B) 5, the CIGS film 3' can be provided in which greater crystal grains are uniformly formed. Cu once contained in the solid phase layer (B) 5 is utilized, so that $Cu_{(2-x)}Se$ is substantially prevented from being excessively taken into the film. In the heating step, the Se vapor generated through sublimation by heating is supplied. This substantially prevents Se from being released outside the system by the heating, making it possible to control the composition ratio of Cu, In and Ga of the CIGS film 3' as desired. In, Ga and Se are further deposited through evaporation on the CIGS film 3' at the same temperature (not lower than 550° C.) as in the heating step to provide the CIGS film 3. Therefore, the CIGS film 3 can be slightly deficient in Cu as a whole. When the CIGS film 3 is used for a device, the CIGS film serves as a light absorbing layer having a higher efficiency.

In the embodiment described above, the formation of the layer (A) 4 and the layer (B) 5 is carried out with the substrate 1 maintained at a temperature of 200° C. not by way of limitation, but may be carried out with the substrate 1 maintained at any desired temperature. However, the formation of the layer (A) 4 and the layer (B) 5 is preferably carried out with the substrate 1 maintained at a temperature of 100° C. to 250° C., particularly preferably at a temperature of 150° C. to 200° C. If the temperature is too high, it will be impossible to form the solid phase layer (B) 5 on the layer (A) 4. If the temperature is too low, on the other hand, it tends to be difficult to form the respective layers through evaporation.

In the embodiment described above, the stacked structure 6 including the layer (A) 4 and the layer (B) 5 is heated for 15 minutes with the substrate 1 maintained at a temperature of 550° C. not by way of limitation, but the heating temperature is preferably not lower than 520° C. The heating period is preferably 1 to 30 minutes, more preferably 2 to 15 minutes. This is because Cu is very rapidly diffused from the layer (B) 5 into the layer (A) 4 but a certain period of time is required for sufficient crystal growth.

In the embodiment described above, In, Ga and Se are further deposited through evaporation on the CIGS film 3' with the substrate 1 maintained at 550° C. after the completion of the heating step. Where a layer containing Cu and Se not taken into the film is unexposed in a surface of the CIGS film 3', however, there is no need to further deposit In, Ga and Se. The further deposition of In, Ga and Se on the CIGS film 3' after the completion of the heating step is preferred, because sufficient crystal growth can be ensured without the formation of a Cu—Se-containing phase in the film and the film easily becomes slightly deficient in Cu as a whole.

In the embodiment described above, the CIGS film 3' obtained after the completion of the heating step has a composition ratio of Cu:In:Ga=25.1:18.5:6.4, i.e., Cu/(In+Ga)≈1 (molar ratio) not by way of limitation, but may have any desired composition ratio. However, the composition ratio of Cu, In and Ga of the CIGS film 3' preferably satisfies an expression 0.95<Cu/(In+Ga)<1.30 (molar ratio). If the value of Cu/(In+Ga) is too small, the Cu component is deficient, failing to ensure sufficient crystal growth. If the value of Cu/(In+Ga) is too great, $Cu_{(2-x)}Se$ is excessively taken into the CIGS film 3'. Where the CIGS film 3' is used for a device, the device characteristic properties are liable to be impaired.

In the embodiment described above, the CIGS film 3 has a composition ratio of Cu:In:Ga=22.1:21.2:7.5, i.e., Cu/(In+Ga)≈0.77 (molar ratio) not by way of limitation, but may have any desired composition ratio. However, a composition ratio satisfying an expression of 0.70<Cu/(In+Ga)<0.95 (molar ratio) is advantageous in that $Cu_{(2-x)}Se$ can be further prevented from being excessively taken into the CIGS film 3 and the film is slightly deficient in Cu as a whole. The ratio of Ga and In which are homologous elements is preferably $0.10<Ga/(In+Ga)<0.40$ In the embodiment described above, the CIGS film 3 is formed as having a thickness of 2.0 μm not by way of limitation, but may have any desired thickness. However, the CIGS film 3 preferably has a thickness of 1.0 to 3.0 μm, more preferably 1.5 to 2.5 μm. If the thickness is too small, the CIGS film 3 is liable to have a reduced light absorbing amount to impair the device characteristic properties when being used as a light absorbing layer. If the thickness is too great, on the other hand, a longer period of time is required for the formation of the film, reducing productivity.

In the embodiment described above, the Se vapor is supplied in the heating step and in the In—Ga—Se evaporation step subsequent to the heating step but, instead, $H_2Se$ may be supplied. In this case, the same effect as provided by the supply of the Se vapor can be provided. Where only a small amount of Se is released from the CIGS film 3' and the CIGS film 3 outside the system, there is no need to supply the Se vapor or $H_2Se$.

Figure 7:
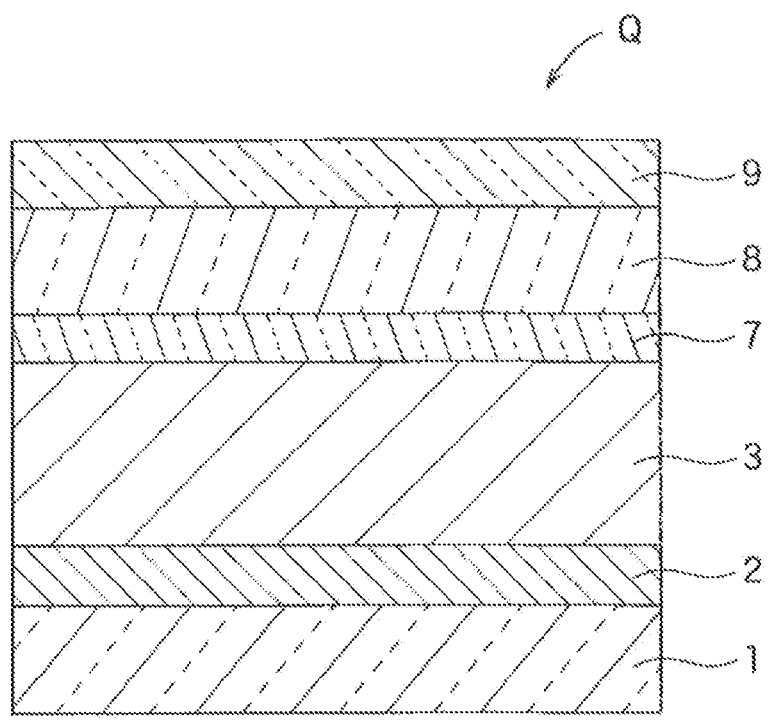
FIG. 7 is a diagram for explaining a CIGS solar cell to be obtained in another embodiment of the present invention.

Next, the construction of a CIGS solar cell Q employing the aforementioned CIGS film 3 as its light absorbing layer and a production method for the CIGS solar cell Q will be described below. As shown in FIG. 7, the CIGS solar cell Q includes a buffer layer 7, a buffer layer 8 and a transparent electrically conductive layer 9 stacked in this order on the CIGS film 3 described above.

More specifically, a buffer layer 7 of cadmium sulfide (CdS) (having a thickness of 50 nm) is formed on the aforementioned CIGS film 3 by a chemical bath deposition process (CBD process), and a buffer layer 8 of ZnO (having a thickness of 50 nm) is formed on the buffer layer 7 by a sputtering process. These buffer layers 7 and 8 are preferably each made of a higher-resistance n-type semiconductor to provide a pn-junction with the CIGS film 3. Instead of the CdS buffer layer and the ZnO buffer layer, a single buffer layer of ZnMgO, Zn(O,S) or the like may be used. The buffer layers 7 and 8 preferably each have a thickness of 30 to 200 nm. Where the single buffer layer is provided, the buffer layer preferably has a thickness of 30 to 200 nm. The buffer layer 7 may be formed by the aforementioned CBD process or other solution process, and the buffer layer 8 may be formed by the aforementioned sputtering process or other vacuum film formation process. Where the plural types of buffer layers are thus stacked for use as a buffer layer, a pn-junction between the buffer layer and the CIGS film 3 can be properly provided. Where a sufficient pn-junction can be provided, the plural types of buffer layers are not necessarily required.

A transparent electrically conductive layer 9 of indium tin oxide (ITO) (having a thickness of 200 nm) is formed on the buffer layer 8 by a sputtering process. A material having a higher transmittance is preferably used for the transparent electrically conductive layer 9, and usable examples of the material include indium zinc oxide (IZO) and zinc aluminum oxide (Al:ZnO) in addition to ITO described above. The transparent electrically conductive layer 9 preferably has a thickness of 100 nm to 300 nm. Thus, the CIGS solar cell Q including the rear electrode layer 2, the CIGS film 3, the buffer layer 7, the buffer layer 8 and the transparent electrically conductive layer 9 stacked in this order over the substrate 1 can be provided.

In the CIGS solar cell production method, as described above, the CIGS film 3 is used as the light absorbing layer. Therefore, the CIGS solar cell Q can be provided, which has a higher conversion efficiency and is less liable to suffer from device-to-device variation in conversion efficiency. In addition, $Cu_{(2-x)}Se$ is not generated in excess in the CIGS film 3 serving as the light absorbing layer, so that the CIGS solar cell Q has a higher efficiency without impairment of the cell characteristic properties. Since the CIGS film 3 is slightly deficient in Cu as a whole, the CIGS solar cell Q has a further higher efficiency.

In the embodiment described above, the solar cell Q, which includes the substrate 1, the rear electrode layer 2, the CIGS film 3, the buffer layer 7, the buffer layer 8 and the transparent electrically conductive layer 9, may further include a metal electrode provided on the transparent electrically conductive layer 9 as required.

Next, an example of the present invention will be described in conjunction with comparative examples. However, the present invention is not limited to the example.

EXAMPLES

Example 1

Figure 8A:
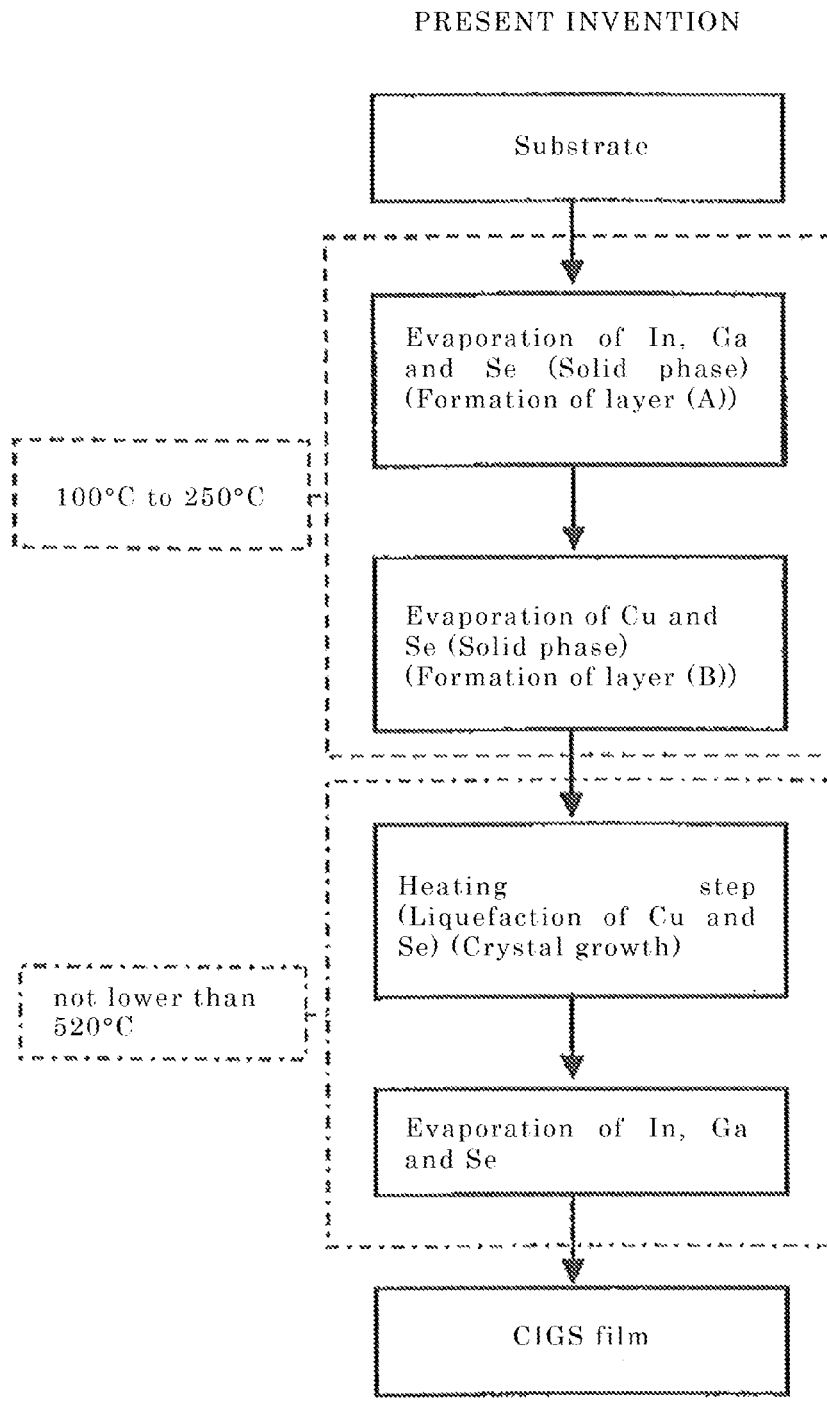
FIG. 8A is a diagram for schematically explaining the present invention.

A CIGS solar cell was produced in the same manner as in the aforementioned embodiment. That is, an SLG (having a size of 30×30 mm and a thickness of 0.55 mm) was prepared as a substrate 1, and Mo was deposited to a thickness of 500 nm over the substrate 1 to form a rear electrode layer 2. With the substrate 1 maintained at a temperature of 200° C., In, Ga and Se were deposited through evaporation to form a layer (A). Then, with the substrate 1 maintained at a temperature of 200° C., Cu and Se were deposited through evaporation on the layer (A) to form a layer (B). Thus, a stacked structure 6 was formed. With the substrate 1 maintained at a temperature of 550° C., a very small amount of Se vapor was supplied, and the stacked structure 6 was maintained in this state for 15 minutes to permit crystal growth, thereby providing a CIGS film 3'. With the substrate 1 maintained at a temperature of 550° C., a very small amount of Se gas was supplied and, in this state, In, Ga and Se were deposited through evaporation on the CIGS film 3'. Thus, an intended CIGS film 3 (having a thickness of 2.0 μm) was provided. In this manner, a CIGS solar cell including the CIGS film 3 was produced as a product of Example 1. A process for producing the product of Example 1 is schematically shown in FIG. 8A.

Comparative Example 1

Figure 9:
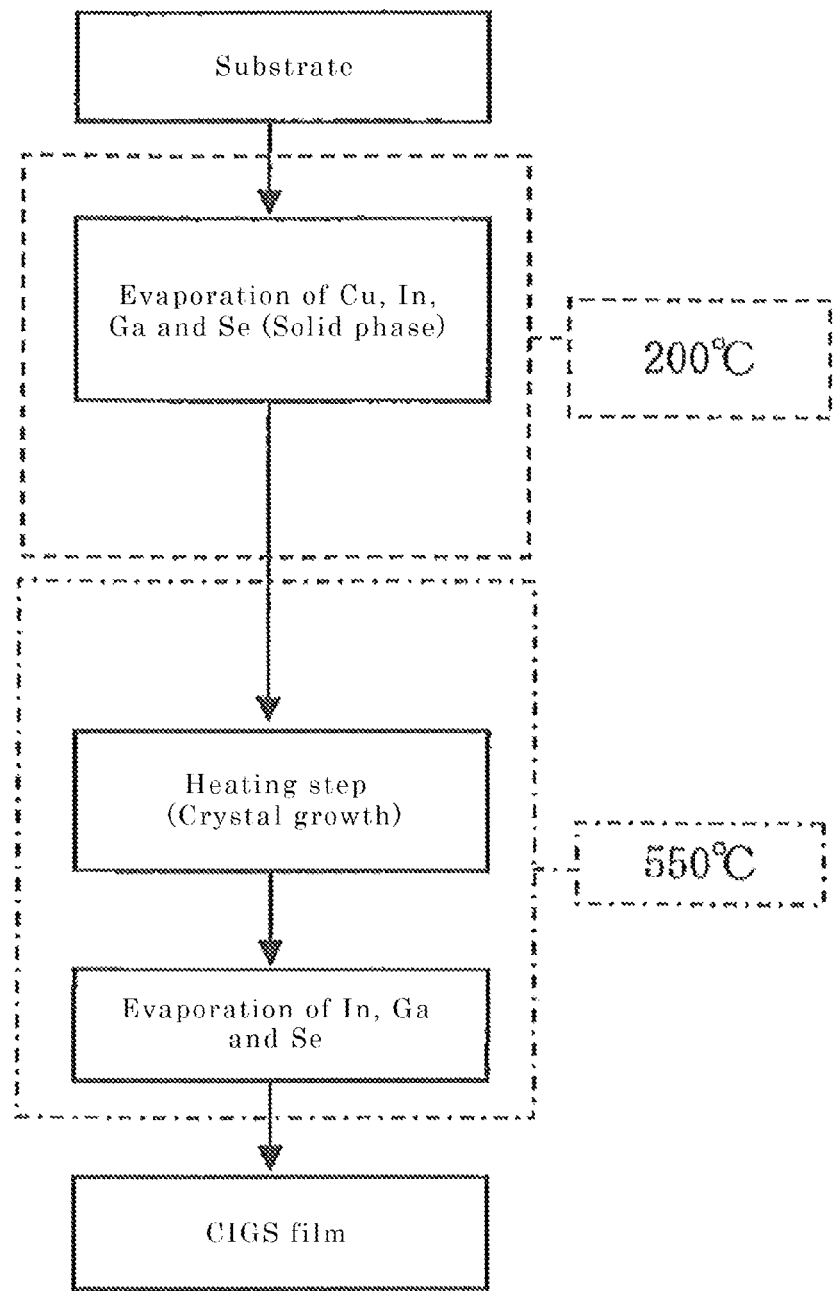
FIG. 9 is a diagram for schematically explaining Comparative Example 1.

A substrate 1 formed with a rear electrode layer 2 was prepared in the same manner as in Example 1. With the substrate 1 maintained at a temperature of 200° C., Cu, In, Ga and Se were deposited through evaporation to form a slightly Cu-rich layer containing Cu, In, Ga and Se. The resulting substrate was heated, while a very small amount of Se gas was supplied. In this state, the substrate 1 was maintained at a temperature of 550° C. for 15 minutes to permit crystal growth, thereby providing a CIGS film (not shown). With the substrate 1 maintained at a temperature of 550° C., a very small amount of Se vapor was supplied and, in this state, In, Ga and Se were deposited through evaporation on the CIGS film, whereby an intended CIGS film (having a thickness of 2.0 μm) was provided. Thus, a CIGS solar cell including this CIGS film was produced as a product of Comparative Example 1. A process for producing the product of Comparative Example 1 is schematically shown in FIG. 9.

Comparative Example 2

Figure 8B:
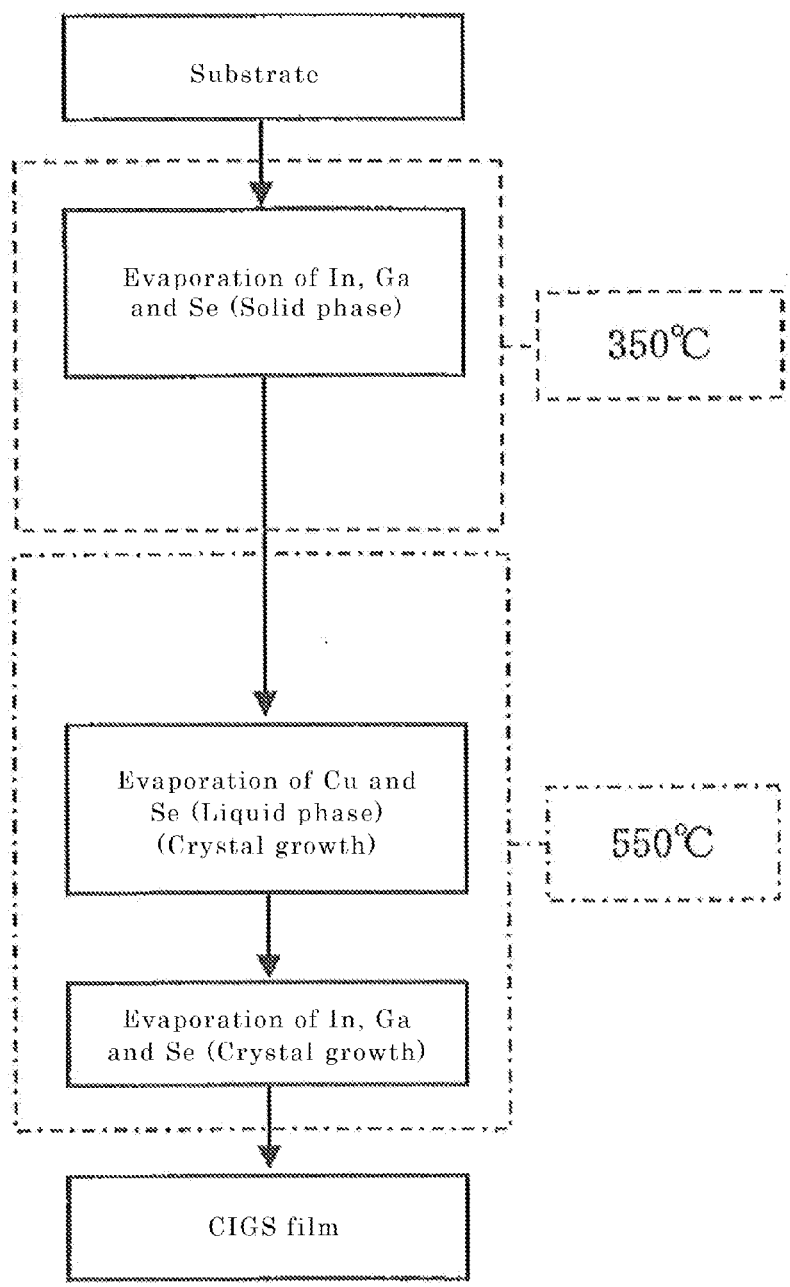
FIG. 8B is a diagram for schematically explaining the prior art.

A substrate 1 formed with a rear electrode layer 2 was prepared in the same manner as in Example 1. With the substrate 1 maintained at a temperature of 350° C., In, Ga and Se were deposited through evaporation to form a layer containing In, Ga and Se. The resulting substrate 1 was heated to be maintained at a temperature of 550° C. and, in this state, Cu and Se were deposited through evaporation on the above layer to permit crystal growth. Thus, a CIGS film (not shown) was provided. With the substrate 1 maintained at a temperature of 550° C., a very small amount of Se vapor was supplied and, in this state, In, Ga and Se were deposited through evaporation on the CIGS film, whereby an intended CIGS film (having a thickness of 2.0 μm) was provided. Thus, a CIGS solar cell including the CIGS film was produced as a product of Comparative Example 2. A process for producing the product of Comparative Example 2 is schematically shown in FIG. 8B.

Ten products were produced in the aforementioned manner for each of the example and the comparative examples, and the conversion efficiency of each of the products was measured in the following manner. Further, the composition ratio Cu/(In+Ga) of the CIGS film of each of the products of the example and the comparative examples was measured and calculated in the following manner. The results of the measurement and the calculation are shown below in Table 1.

<Measurement of Conversion Efficiency>

The products of the example and the comparative examples were each irradiated with artificial sunlight (AM1.5) applied over a region having a greater area than a front surface thereof, and then the conversion efficiency of each of the products was measured by a solar simulator (CELL TESTER YSS150 available from Yamashita Denso Co., Ltd.)

<Calculation of Composition Ratio Cu/(In+Ga)>

The contents of Cu, In and Ga of the CIGS film used for each of the products of the example and the comparative examples were measured by an energy dispersive X-ray fluorescence analyzer (EX-250 available from Horiba Ltd.) and the composition ratio Cu/(In+Ga) was calculated based on atom densities thus measured.

TABLE 1

|  | Example 1 | Comparative Example 1 | Comparative Example 2 |
| --- | --- | --- | --- |
| Average conversion efficiency (%) | 14.7 | 9.5 | 13.6 |
| Maximum conversion efficiency (%) | 15.5 | 11.0 | 14.8 |
| Minimum conversion efficiency (%) | 13.0 | 8.0 | 11.2 |
| Composition ratio Cu/(In + Ga) | 0.82 | 0.85 | 0.83 |
| Variation (Maximum conversion efficiency − Minimum conversion efficiency) | 2.5 | 3.0 | 3.6 |

The above results indicate that the product of Example 1 has a higher average conversion efficiency with a value of 14.7% and a smaller device-to-device variation in conversion efficiency with a value of 2.5 and, therefore, the inventive production method makes it possible to produce a higher efficiency solar cell at higher reproducibility. In contrast, the product of Comparative Example 1 has a relatively small variation in conversion efficiency with a value of 3.0 and a lower average conversion efficiency with a value of 9.5%. The product of Comparative Example 2 has a relatively high average conversion efficiency with a value of 13.6% and a greater variation in conversion efficiency with a value of 3.6.

While specific forms of the embodiments of the present invention have been shown in the aforementioned inventive example, the inventive example is merely illustrative of the invention but not limitative of the invention. It is contemplated that various modifications apparent to those skilled in the art could be made within the scope of the invention.

The inventive CIGS film production method is suitable for producing a CIGS film having excellent characteristic properties at higher reproducibility for use as a light absorbing layer of a CIGS solar cell. Further, the inventive CIGS solar cell production method is suitable for producing a solar cell having a higher conversion efficiency at higher reproducibility.

The invention claimed is:

1. A method for producing a CIGS film to be used as a light absorbing layer for a CIGS solar cell, the method comprising:
    stacking a layer (A) comprising indium, gallium and selenium and a layer (B) comprising copper and selenium in a solid phase in this order over a substrate; and
    heating a stacked structure including the layer (A) and the layer (B) to melt the layer (B) into a liquid phase to thereby diffuse copper from the layer (B) into the layer (A) to permit crystal growth, thereby providing the CIGS film,
    wherein the CIGS film obtained at completion of the heating has a molar ratio satisfying 0.95<copper/(indium+gallium)<1.30,
    wherein while the temperature for the heating is maintained, indium, gallium and selenium are further deposited through evaporation on the CIGS film obtained by the heating, to allow the CIGS film to have a molar ratio satisfying 0.70<copper/(indium+gallium)<0.95.

2. The method according to claim 1, wherein the stacking is performed at a temperature of 100° C. to 250° C.

3. The method according to claim 1, wherein the heating is performed at a temperature of not lower than 520° C.

4. The method according to claim 1, wherein temperature increase from the temperature for the stacking to the temperature for the heating is carried out at a temperature increase rate of not less than 10° C./sec.

5. The method according to claim 1, wherein selenium vapor or hydrogen selenide is supplied to maintain a selenium partial pressure at a higher level on a surface of the CIGS film than inside the CIGS film during the heating.

6. A CIGS solar cell production method comprising:
    providing a rear electrode layer over a substrate;
    providing a light absorbing layer;
    providing a buffer layer; and
    providing a transparent electrically conductive layer;
    wherein the method according to claim 1 is employed for the providing of the light absorbing layer.

* * * * *